(12) United States Patent
Kitamura et al.

(10) Patent No.: US 6,593,186 B1
(45) Date of Patent: Jul. 15, 2003

(54) METHOD FOR MANUFACTURING NON-VOLATILE SEMICONDUCTOR MEMORY DEVICE

(75) Inventors: Takuya Kitamura, Tokyo (JP); Hiroki Koga, Tokyo (JP)

(73) Assignee: NEC Electronics Corporation, Kanagawa-Pref. (JP)

(*) Notice: Subject to any disclaimer, the term of this patent is extended or adjusted under 35 U.S.C. 154(b) by 0 days.

(21) Appl. No.: 09/717,133

(22) Filed: Nov. 22, 2000

Related U.S. Application Data

(62) Division of application No. 09/299,639, filed on Apr. 27, 1999, now abandoned.

(30) Foreign Application Priority Data

Apr. 30, 1998 (JP) .............................................. 10-120294

(51) Int. Cl.[7] .............................................. H01L 21/336
(52) U.S. Cl. ...................................... 438/257; 257/315
(58) Field of Search ............................. 438/257, 260; 257/314, 315, 316, 317

(56) References Cited

U.S. PATENT DOCUMENTS

| 5,567,637 A | 10/1996 | Hirota |
| 5,973,353 A | 10/1999 | Yang et al. |
| 6,008,517 A | 12/1999 | Wu |
| 6,188,101 B1 * | 2/2001 | Wang .......................... 257/314 |

FOREIGN PATENT DOCUMENTS

| JP | 57-39583 | * 3/1982 |
| JP | 61-161769 | 7/1986 |
| JP | 61-171167 | 8/1986 |
| JP | 63-248176 | 10/1988 |
| JP | 63-278275 | 11/1988 |
| JP | 3-34578 | 2/1991 |
| JP | 4-56265 | * 2/1992 |
| JP | 5-110026 | 4/1993 |
| JP | 6-188384 | 7/1994 |
| JP | 7-130886 | 5/1995 |
| JP | 9-205156 | 8/1997 |
| JP | 10-173074 | 6/1998 |
| JP | 10-229138 | 8/1998 |
| KR | 95-59519 | 12/1995 |
| KR | 97-54185 | 7/1997 |

* cited by examiner

Primary Examiner—Douglas A. Wille
(74) Attorney, Agent, or Firm—McGinn & Gibb, PLLC

(57) ABSTRACT

In a non-volatile semiconductor memory device that has a floating gate that is formed on a semiconductor substrate with an intervening first gate insulation film, a second gate insulation film that is formed on the floating gate electrode, and a control gate that is provided over this second gate insulation film, at least two trenches are formed in the floating gate.

12 Claims, 17 Drawing Sheets

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

METHOD FOR MANUFACTURING NON-VOLATILE SEMICONDUCTOR MEMORY DEVICE

This is a division of application Ser. No. 09/299,639, filed Apr. 27, 1999, now abandon.

BACKGROUND OF THE INVENTION

1. Field of the Invention

The present invention relates to a non-volatile semiconductor memory device, and more particularly to a structure of a memory cell and a method manufacturing such a memory cell structure.

2. Description of the Related Art

FIG. 18 is a cross-sectional view of a general floating-gate type non-volatile semiconductor memory device of the past. In this device, field insulation film 101 on the surface of a p-type substrate 100 is used to electrically separate a memory cell region from a neighboring memory cell region, an n-type source 109 and drain 110 being formed, and a memory channel region 113 being formed so as to be sandwiched between this source and drain. On the channel region 113 a floating gate 103 is formed, with an intervening first gate insulation film 102 therebetween, and on this floating gate 103, a control gate 112 is formed, with an intervening second gate insulation film 111 therebetween.

The method of manufacturing the above-noted structure is to form on the silicon substrate 100 the field insulation film 101, the first gate insulation film 102, and the channel region 113, after which polysilicon is deposited onto the surface, this then being processed to form the shape of a floating gate. Then, an n-type dopant is introduced, so as to form the floating gate 103, the drain 110, and the source 109. Onto this surface a silicon oxide film is formed by thermal oxidation, and a second gate insulation film 111 is formed by either this silicon oxide film only, or by this film laminated together with a silicon nitride film. Additionally, the control gate 112 is formed, thereby forming a stacked-gate non-volatile semiconductor memory device.

The writing characteristics of a non-volatile semiconductor memory device are determined by the junction capacitance due to the first gate insulation film 102 between the channel region 113 and the floating gate 103, and the junction capacitance between the floating gate 103 and the control gate 112 due to the second gate insulation film 111, and to effectively increase the voltage that is applied to the floating gate 103, it is necessary to make the junction capacitance between the floating gate 103 and control gate 112 due to the second gate insulation film 111 large.

A method of accommodating this is to have the floating gate extend in a planar manner on the field insulation film. For this reason, it was difficult to achieve a high capacity in a stacked-gate type semiconductor memory device.

Because of the above, a structure, such as shown in FIG. 17, has been invented and disclosed in the Japanese Unexamined Patent Publication No.4-74477, wherein in a floating gate type semiconductor memory device formed by a floating gate 203 formed with an intervening first gate insulation film 202 on a semiconductor substrate 100 and a control gate 212 that is capacitively coupled to the floating gate 203 via a second gate insulation film 211, this device having deep trench-shaped floating gate formed by a trench shape that reflects the shape of the underlayer, a second gate insulation film being formed on at least the inner wall surface part of the trench shape of the floating gate.

However, when forming a trench shape such as shown in FIG. 17 and FIG. 18 in the floating gate polysilicon films 211 and 111, it was not possible to form more than one trench for each photolithography process. For this reason, the junction capacitance between the floating gate and the control gate is determined according to depth of the trench, making it impossible to achieve an increase in capacitance.

Accordingly, it is an object of the present invention to provide an improvement over the drawbacks as noted above in the prior art, by providing in particular a novel non-volatile semiconductor memory device in which alternate films of silicon oxide and silicon nitride are formed and etch back is performed to formed a hard mask, thereby forming a trench shape that has two or more trenches that form a self-aligned floating gate, a second gate insulation film and control gate being formed therealong, so that the junction capacitance between the control gate and the floating gate is increased, the result being the achievement of low-voltage, high-speed operation. An additional object of the present invention is provide a method of manufacturing the above-noted non-volatile semiconductor memory device.

SUMMARY OF THE INVENTION

In order to achieve the above-noted object, the present invention adopts the following basic technical constitution.

Specifically, the first aspect of the present invention is a non-volatile semiconductor memory device that has a floating gate that is formed onto a semiconductor substrate with intervening a first gate insulation film therebetween, a second gate insulation film that is formed on this floating gate, and a control gate that is provided over the second gate insulation film, wherein at least two trenches are formed in the above-noted floating gate.

In a second aspect of the present invention, at least one of the trenches is deeper than a trench that is formed to reflect the shape of the underlayer.

In a third aspect of the present invention, a drain-source region is formed so as to be parallel to the above-noted trenches.

In a fourth aspect of the present invention, the drain-source region is formed so as to be perpendicular to the above-noted trenches.

The first aspect of a method of manufacturing a non-volatile semiconductor memory device according to the present invention is a method comprising, a first step of sequentially depositing in an element forming region, a first gate oxide film 2, a polysilicon film 3, a first silicon oxide film 4, and a first silicon nitride film 5, in that sequence (FIG. 2(a)), a second step of processing said first silicon nitride film 5 to a prescribed shape and expose said first silicon oxide film 4 (FIG. 2(b)), a third step of sequentially forming onto a side wall of said first silicon nitride film 5, a second silicon oxide film 6, a second silicon nitride film 7, and a third silicon oxide film 8, so as to form a side wall and expose said polysilicon film 3 (FIG. 3(b)), a fourth step of etching said exposed polysilicon film 3 (FIG. 3(c)), a fifth step of removing said first and second silicon nitride film 5, 7 (FIG. 3(c)), a sixth step of removing said exposed silicon oxide film 4 (FIG. 4(a)), and a seventh step of using said second and third silicon oxide film 6, 8 on said polysilicon film 3 as a mask, and etching said polysilicon film 3, thereby forming said floating gate that has a trench (FIG. 4(c)).

A second aspect of a method of manufacturing a non-volatile semiconductor memory device according to the present invention is a method comprising, a first step of sequentially depositing in an element forming region, a first gate oxide film 2, a polysilicon film 3, a first silicon oxide film 4, a first silicon nitride film 5, and a second silicon oxide film 6 in this sequence (FIG. 12(a)), a second step of processing said second silicon oxide film 6 to a prescribed shape and expose said first silicon nitride film 5 (FIG. 12(b)), a third step of forming onto a side wall of said second silicon oxide film 6 a second silicon nitride film 7 side wall (FIG. 12(c)), a fourth step of removing said second silicon oxide film 6 (FIG. 13(a)), a fifth step of forming a third silicon oxide film 8 side wall on both sides of the remaining said second silicon nitride film 7 (FIG. 13(b)), a sixth step of removing said exposed first silicon nitride film 5 and said second silicon nitride film 7 and expose said first silicon oxide film 4 (FIG. 13(c)), a seventh step of removing said exposed first silicon oxide film 4, and an eighth step of using said first silicon oxide film 4, said first silicon nitride film 5, and said third silicon oxide film 8 on said polysilicon film 3 as a mask, and etching said polysilicon film 3, thereby forming said floating gate that has a trench.

In a stacked-gate memory cell according to the present invention, by alternately forming silicon oxide and silicon nitride films and then using etch back to form a hard mask, a trench shape is formed in a self-aligned floating gate, a second gate insulation film and a control gate being formed therealong, so that the junction capacitance between the control gate and the floating gate is increased, thereby enabling low-voltage, high-speed operation.

DESCRIPTION OF THE PREFERRED EMBODIMENTS

Figure 1:
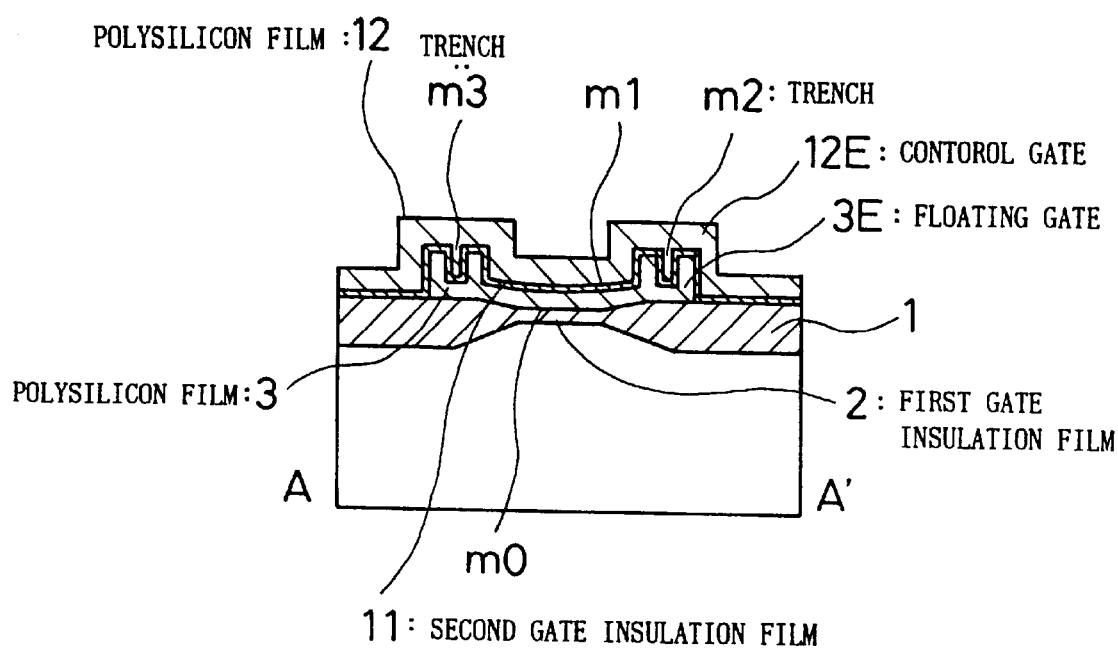
FIG. 1 is a schematic cross-sectional view of a first example of a non-volatile semiconductor memory device according to the present invention.
Figure 2:
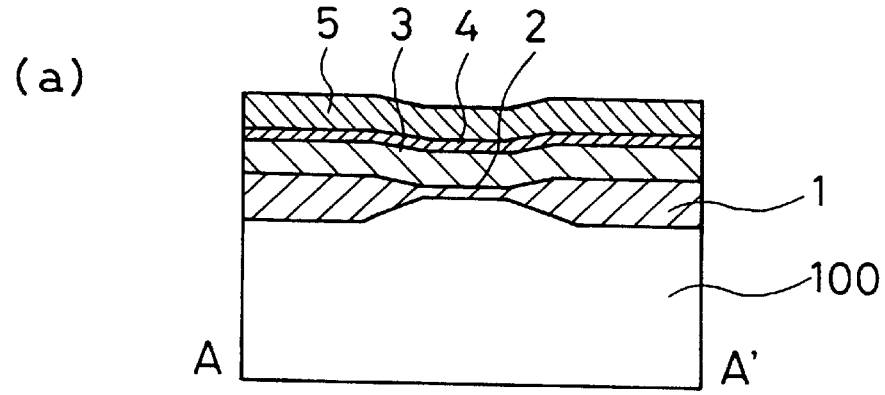
FIG. 2 is a drawing that shows the manufacturing processes for the first example of the present invention.
Figure 2:
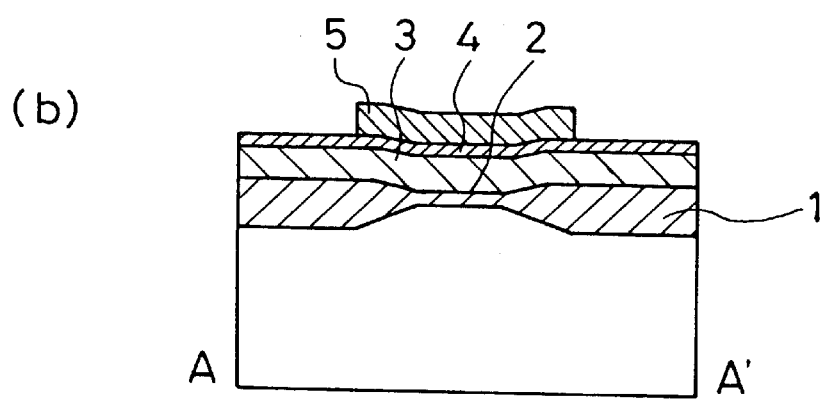
Figure 2:
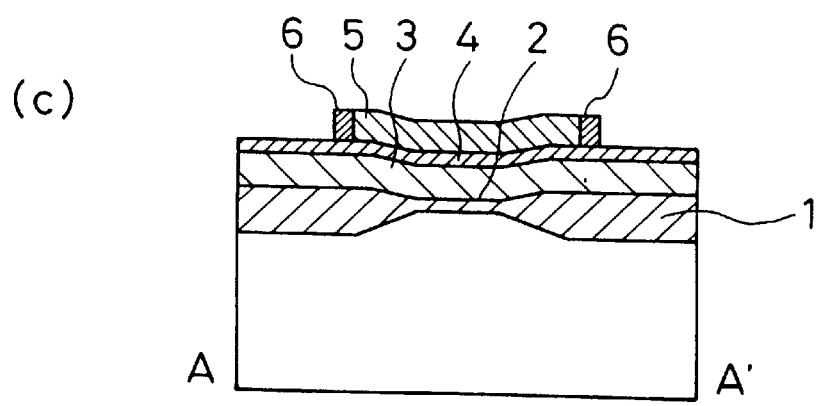
Figure 3:
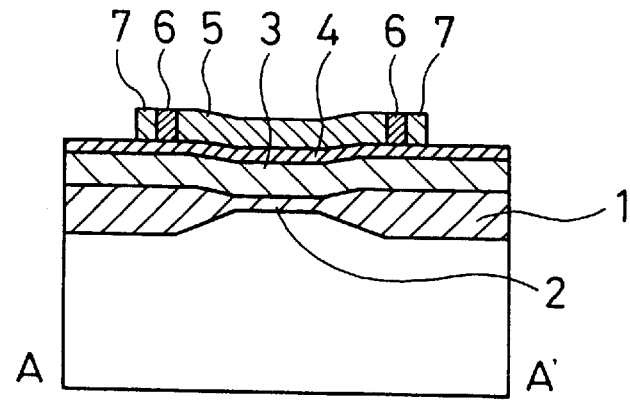
FIG. 3 is a drawing that shows the manufacturing processes subsequent to those shown in FIG. 2.
Figure 3:
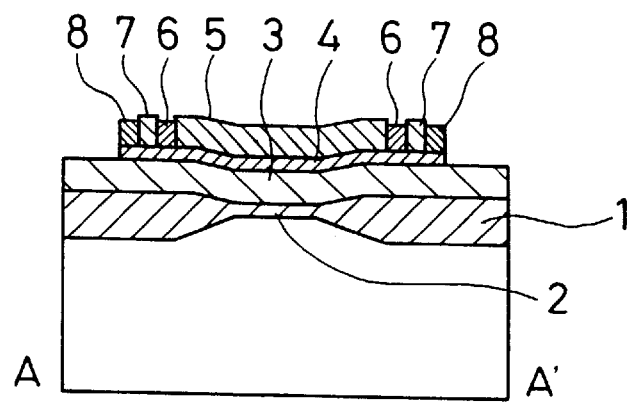
Figure 3:
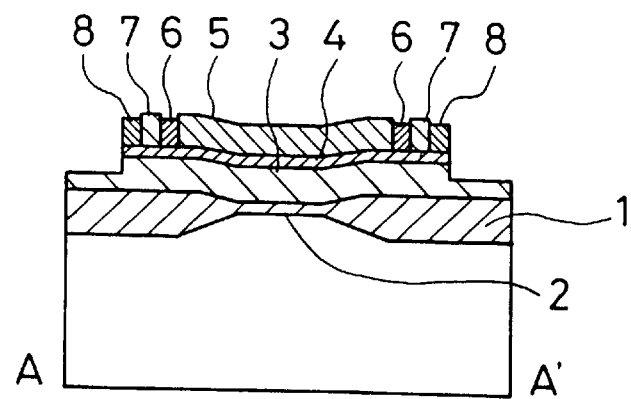
Figure 4:
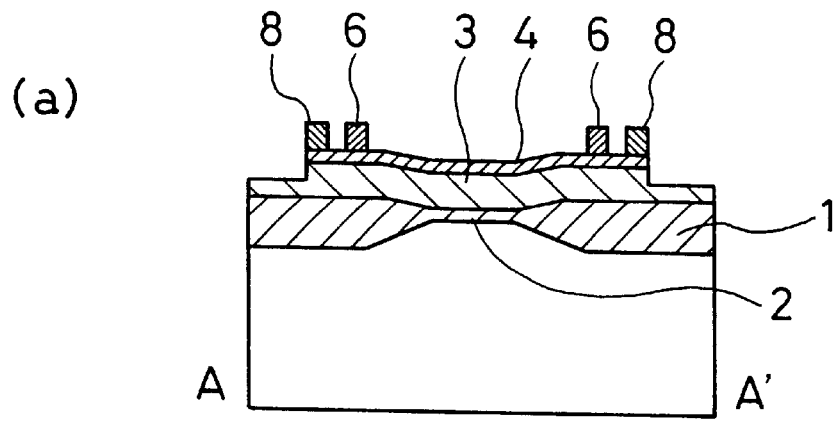
FIG. 4 is a drawing that shows the manufacturing processes subsequent to those shown in FIG. 3.
Figure 4:
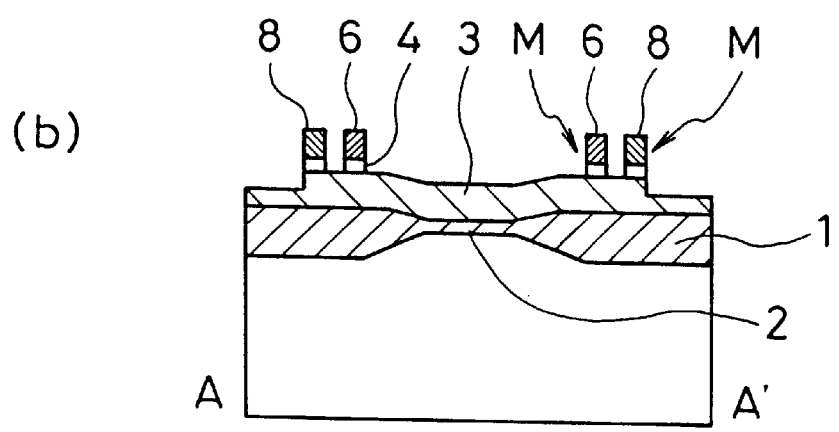
Figure 4:
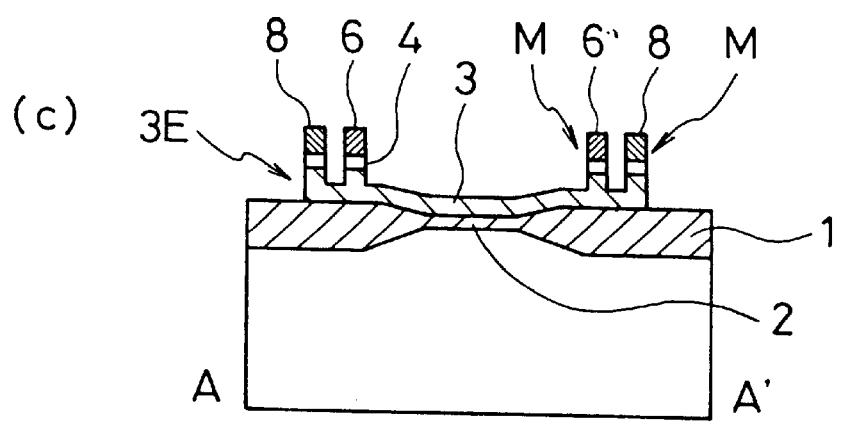
Figure 5:
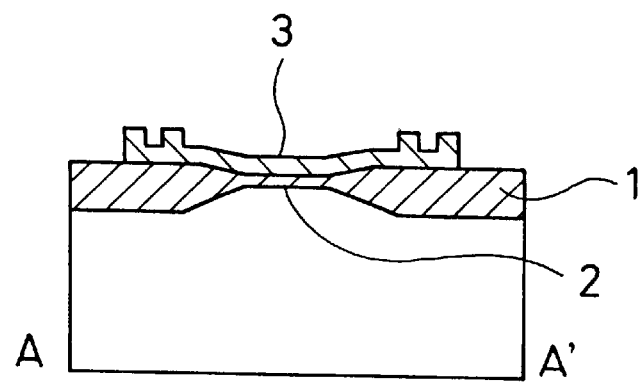
FIG. 5 is a drawing that shows the manufacturing processes subsequent to those shown in FIG. 4.
Figure 5:
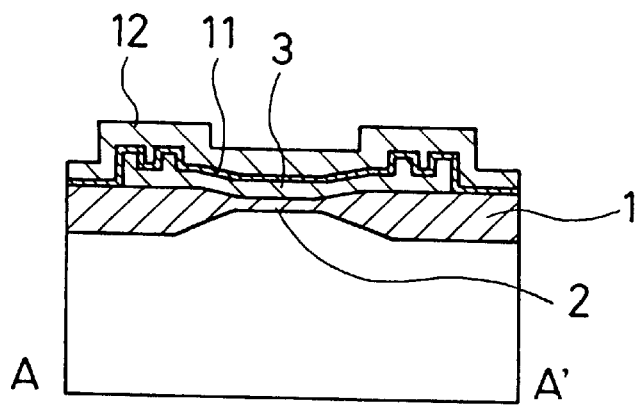
Figure 5:
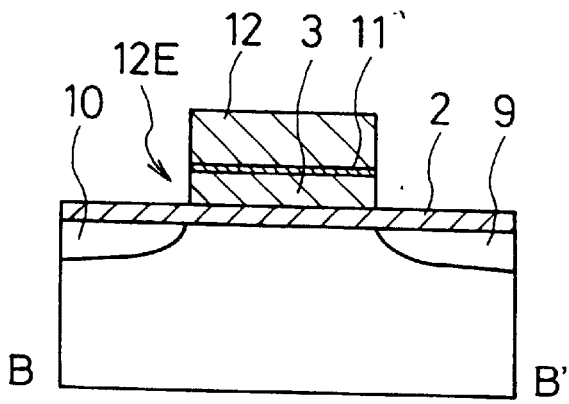

Embodiments of a non-volatile semiconductor memory device and manufacturing method therefore according to the present invention will be described in detail below, with references being made to relevant accompanying drawings.

FIG. 1 through FIG. 6 are drawings that show the process steps for manufacturing a non-volatile semiconductor memory device according to the present invention.

These drawings show a non-volatile semiconductor memory device that has a floating gate 3E that is formed on a semiconductor substrate 100 with a first gate insulation film 2 therebetween, a second gate insulation film 11 that is formed on the above-noted floating gate 3E, and a control gate 12E that is provided over the second gate insulation film 11, wherein minimally the trenches m1, m2, and m3 are formed in the floating gate 3E. In this device, at least one of the above-noted trenches m2 is deeper than the trench m1, reflecting the shape m0 of the underlayer.

The present invention is described in further detail below.

In a memory application of this example of the present invention, a silicon oxide film is used as a gate oxide film, a laminate of a silicon oxide film, a silicon nitride film, and a silicon oxide film is used as a capacitive insulation film, and a silicon substrate is used as the semiconductor substrate.

The first example of the present invention will be described with reference to FIG. 1 through FIG. 6.

First, as shown in FIG. 2(a), on the element region of a silicon substrate 100 onto which is formed an element separation region using the LOCOS separation method, thermal oxidation is used to form a tunnel gate oxide film (first gate oxide film) 2 having a film thickness of 80 Angstroms. Then, a polysilicon film 3 having a thickness of 3000 Angstroms for use as a floating gate electrode, a silicon oxide film 4 having a thickness of 300 Angstroms, and a silicon nitride film 5 having a thickness, of 1500 Angstroms are formed in this sequence, using a CVD process. The silicon nitride film 5 is striped by using photolithography and dry etching processes (FIG. 2(b)). Additionally, the CVD process is used to form a silicon oxide film 6 having a thickness of 500 Angstroms, this being etched back so as form a silicon oxide film 6 side wall on the side wall of the striped silicon nitride film 5 (FIG. 2(c)). Then, a CVD process is used to form a silicon nitride film 7 having a thickness of 500 Angstroms, this forming a silicon nitride film 7 side wall on the outside of the silicon oxide film 6 side wall that was just formed by etching back (FIG. 3(a)). Additionally, the CVD process is used to form a silicon oxide film 8 having a thickness of 500 Angstroms, the silicon oxide film 8 being etched back as far as the polysilicon film 3 that will serve as the floating gate, thereby further forming a silicon oxide film 8 side wall on the outside of the silicon nitride film 7 (FIG. 3(b)). After this is done, dry etching is performed to etch away approximately 1500 Angstroms of the silicon oxide film 3 (FIG. 3(c)), and hot phosphoric acid is used to remove the exposed nitride films 5 and 7 (FIG. 4(a)), and then the silicon oxide film 4 that was exposed is etched by the dry etching approximately 500 to 800 Angstroms (FIG. 4(b)), the remaining silicon oxide film M being used as a hard mask to etch the approximately 1500 Angstroms of remaining polysilicon film 3, thereby forming the floating gate electrode 3E in the form of a trench (FIG. 4(c)). Wet etching is then done to remove residual silicon oxide film M from the floating gate (FIG. 5(a)), and an ONO (oxiden-nitride-oxide film) 11 is then formed over the entire surface, this being the second gate insulation film. Additionally, a polysilicon film 12 for use as a control gate electrode is deposited over the entire surface of the substrate, and photolithography and dry etching are used to etch the polysilicon film 12 that will serve as the control gate 12E, the second gate insulation film 11 and the polysilicon film 3 that will serve as the floating gate electrode until the tunnel gate oxide film 2 that is the first gate oxide film is exposed as a pattern that is perpendicular to the striped pattern of the polysilicon film 3 pattern, this being used as the control gate electrode pattern that corresponds to a word line. Finally, the control gate electrode pattern is used as a mask to perform arsenic ion implantation, thereby forming the source 9 and drain diffusion layer 10 (FIG. 5(b)). A schematic cross-sectional view in the source-drain direction is shown in FIG. 5(c).

Figure 6:
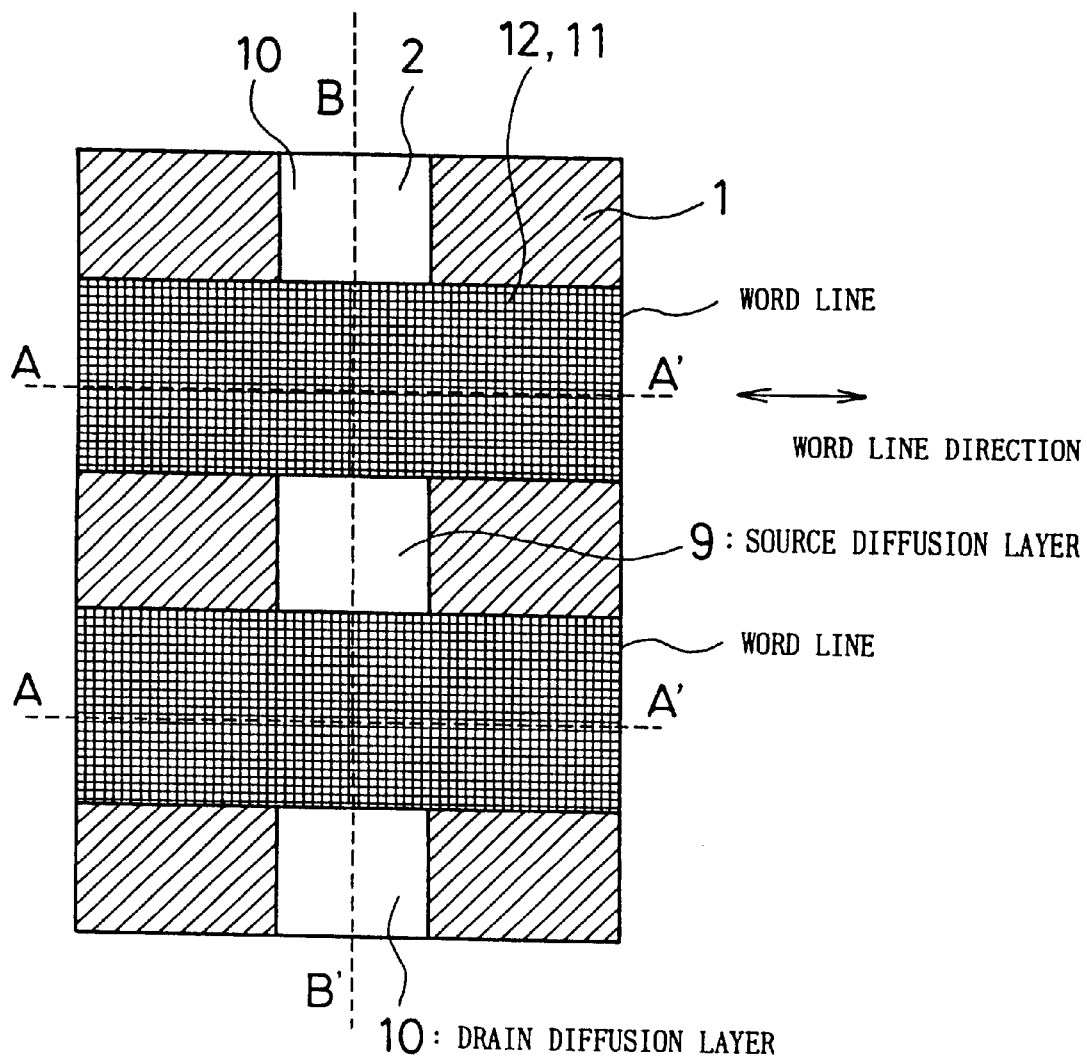
FIG. 6 is a top plan view of the first example of a non-volatile semiconductor memory device according to the present invention.
Figure 7:
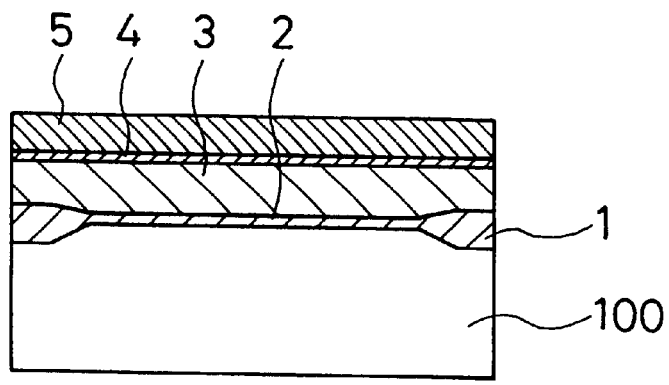
FIG. 7 is a drawing that shows the manufacturing processes for the second example of the present invention.
Figure 7:
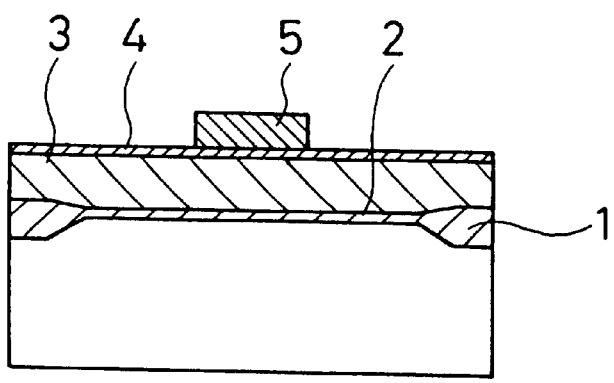
Figure 7:
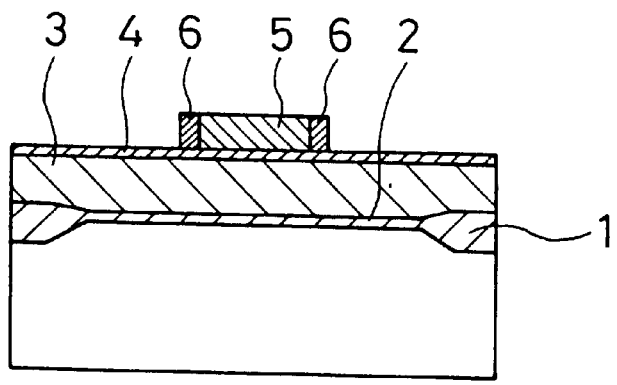
Figure 8:
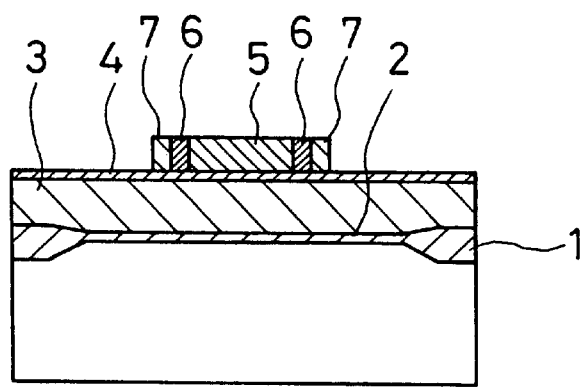
FIG. 8 is a drawing that shows the manufacturing process subsequent to those shown in FIG. 7.
Figure 8:
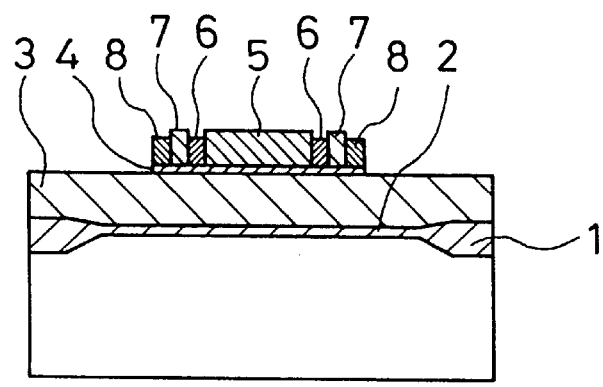
Figure 8:
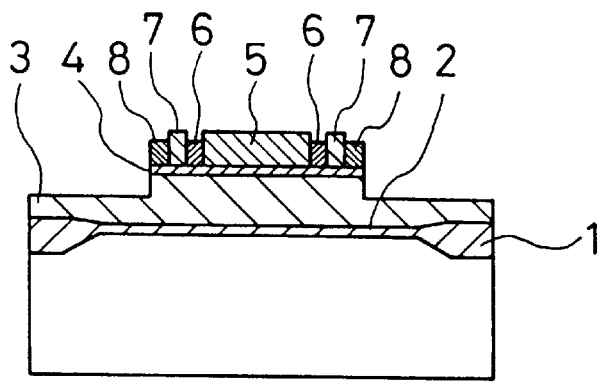
Figure 9:
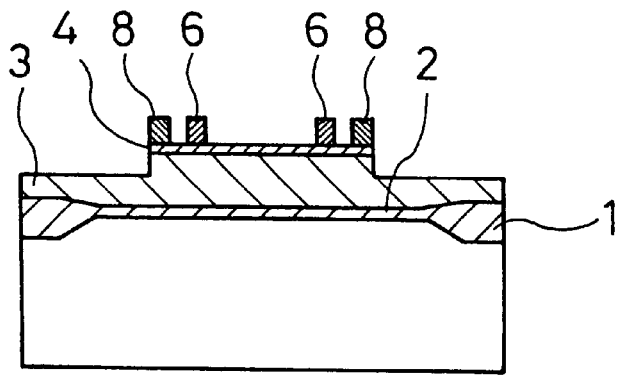
FIG. 9 is a drawing that shows the manufacturing process subsequent to those shown in FIG. 8.
Figure 9:
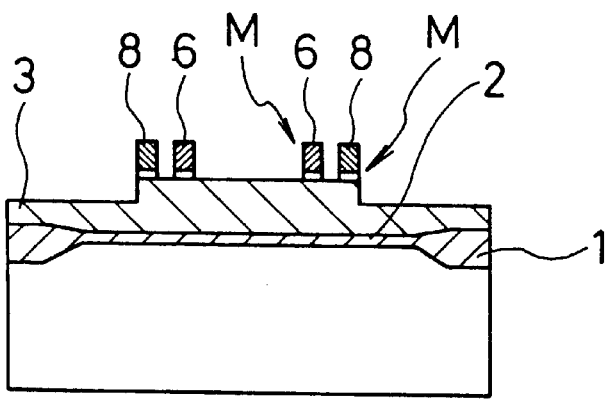
Figure 9:
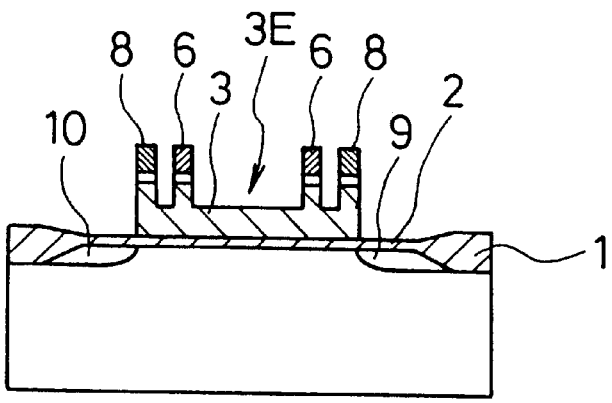
Figure 10:
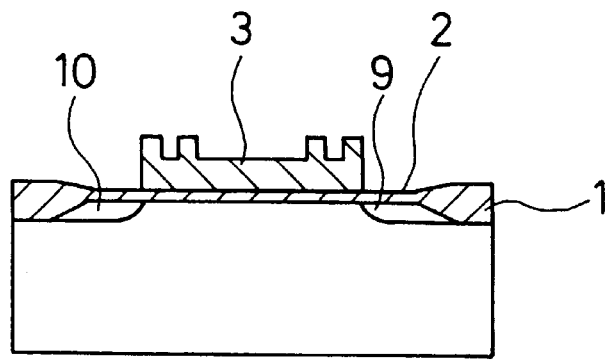
FIG. 10 is a drawing that shows the manufacturing process subsequent to those shown in FIG. 9.
Figure 10:
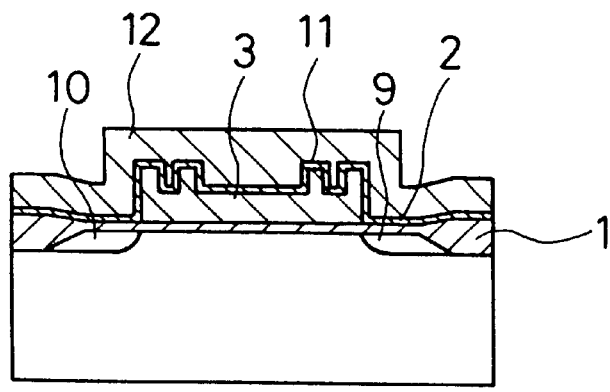
Figure 10:
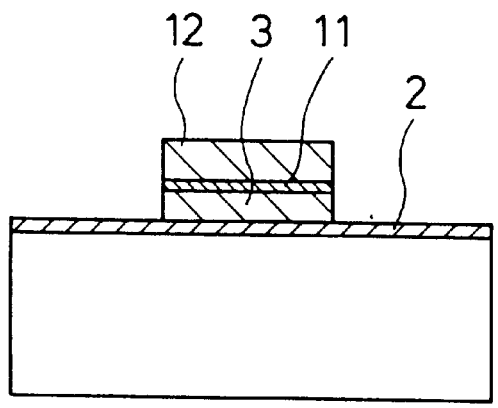
Figure 11:
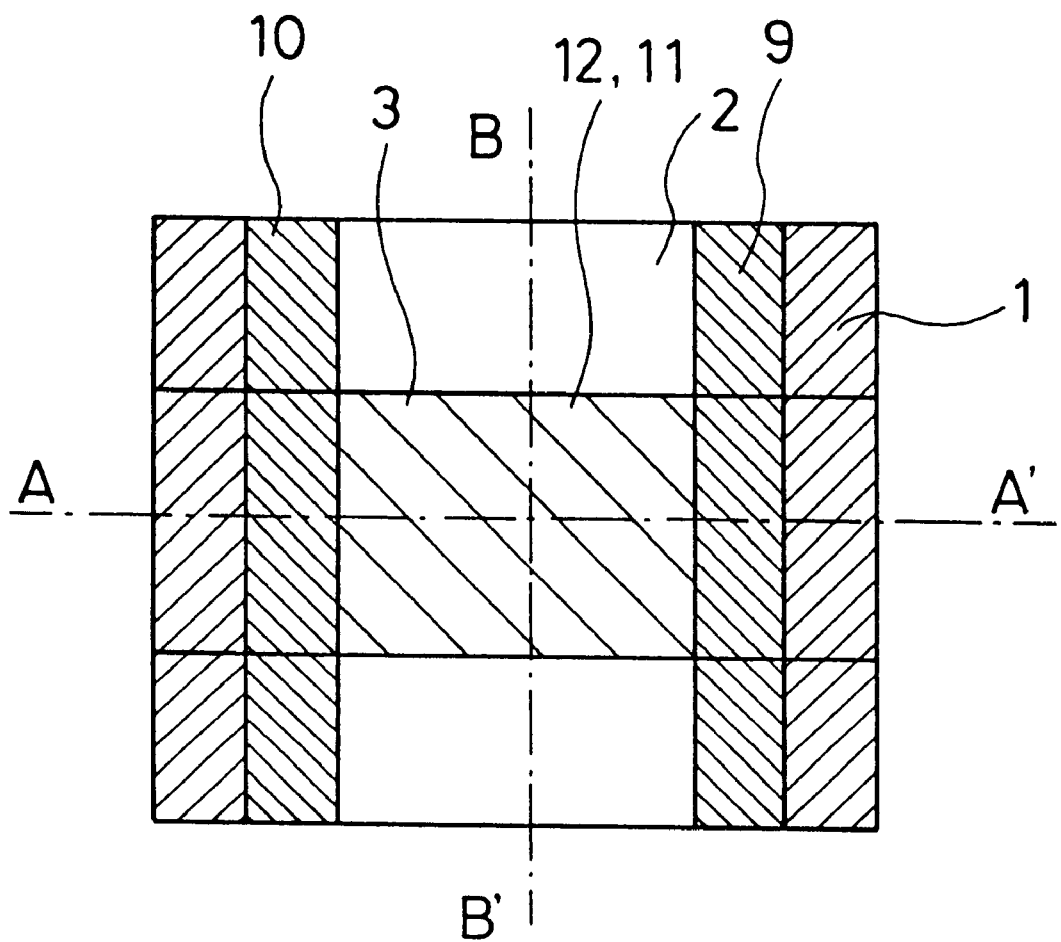
FIG. 11 is a top plan view of the second example of a non-volatile semiconductor memory device according to the present invention.
Figure 12:
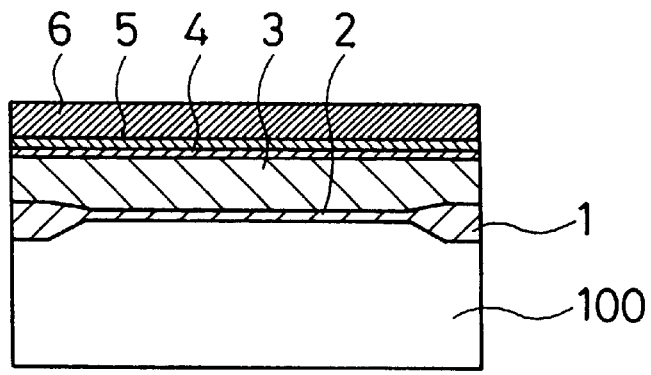
FIG. 12 is a drawing that shows the manufacturing processes for the third example of the present invention.
Figure 12:
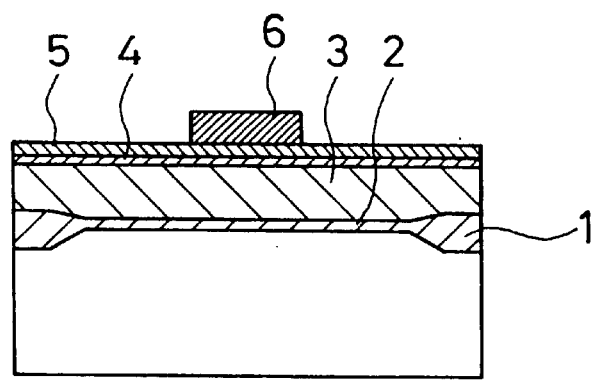
Figure 12:
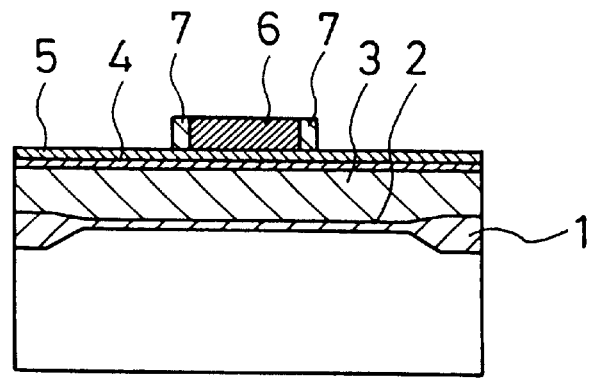
Figure 13:
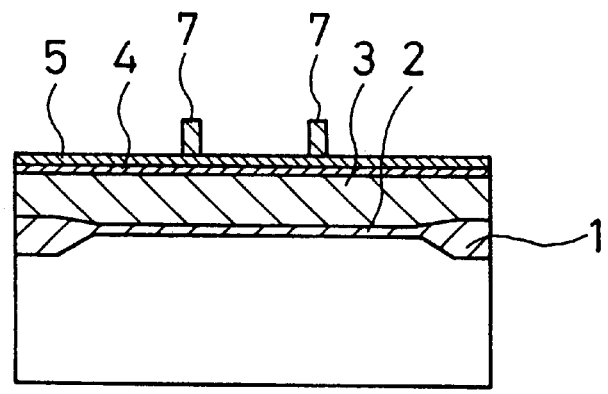
FIG. 13 is a drawing that shows the manufacturing processes subsequent to those shown in FIG. 12.
Figure 13:
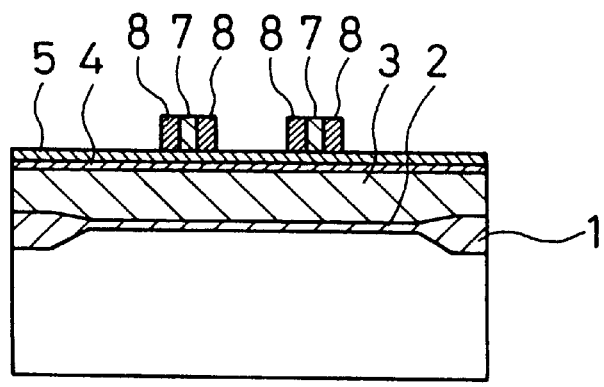
Figure 13:
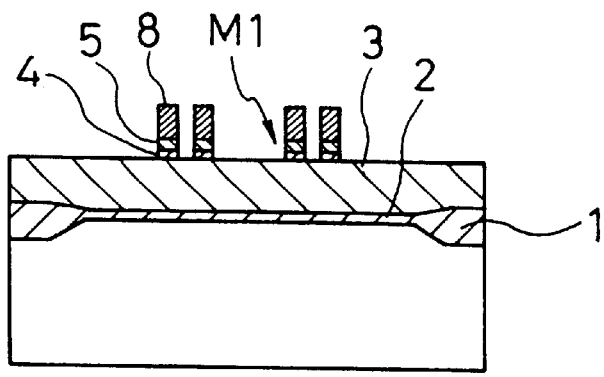

FIG. 6 is a drawing that shows the substrate as seen from the control gate, in which the source region 9 and drain region 10 are provided so as to be perpendicular to the trenches m1 and m2. The depth of the trench m2 is made sufficiently greater than the depression that reflects the shape of the underlayer.

Next, the second example of the present invention will be described, with reference being made to FIG. 7 through FIG. 11.

There is no restriction to the use of the LOCOS separation method to achieve element separation, application also being possible in the case of recess LOCOS or STI (shallow-trench isolation). The shape of the floating gate does not need to extend to the element separation region. Next, an example in which there is no overlap with the element separation region will be described.

First, as shown in FIG. 7(a), on the element region of a silicon substrate 100 onto which is formed an element separation region using the LOCOS separation method, thermal oxidation is used to form a tunnel gate oxide film 2 having a thickness of 80 Angstroms. Then, a polysilicon film 3 having a thickness of 3000 Angstroms for use as a floating gate electrode, a silicon oxide film 4 having a thickness of 300 Angstroms, and a silicon nitride film 5 having a thickness of 1500 Angstroms are formed in this sequence, using a CVD process. The silicon nitride film 5 is striped by using photolithography and dry etching processes (FIG. 7(b)). Additionally, the CVD process is used to form a silicon oxide film 6 having a thickness of 500 Angstroms, this being etched back so as form a silicon oxide film 6 side wall on the side wall of the striped silicon nitride film 5 (FIG. 7(c)). Then a CVD process is used for form a silicon nitride film 7 having a thickness of 500 Angstroms, this being etched back to form a silicon nitride film 7 side wall on the outside of the silicon oxide film 6 that was just formed by etching back (FIG. 8(a)). Additionally, the CVD process is used to form a silicon oxide film 8 having thickness of 500 Angstroms, the silicon oxide film 8 being etched back far enough to expose the polysilicon film 3 that will serve as the floating gate, thereby further forming a silicon oxide film 8 side wall on the outside of the silicon nitride film 7 (FIG. 8(b)). After this is done, dry etching is performed to etch away approximately 1500 Angstroms of the silicon oxide film 3 (FIG. 8(c)), and then hot phosphoric acid is used to remove the exposed nitride films 5 and 7 (FIG. 9(a)). After that, dry etching is done to etch from 500 to 800 Angstroms of the silicon oxide film 4 (FIG. 9(b)), the remaining silicon oxide film M being used as a hard mask to etch the approximately 1500 Angstroms of remaining polysilicon film 3, thereby forming the floating gate electrode 3E in the form of a trench, the floating gate electrode pattern being used as a mask to perform arsenic ion implantation, thereby forming the source 9 and drain diffusion layer 10 (FIG. 9(c)). Wet etching is then done to remove residual silicon oxide film M from the floating gate (FIG. 10(a)), and an ONO (oxide-nitride-oxide film) 11 is then formed over the entire surface, this being the second gate insulation film. Additionally, a polysilicon film 12 for use as a control gate electrode is deposited over the entire surface of the substrate, and photolithography and dry etching are used to etch the polysilicon film 12 that will serve as the control gate 12E, the second gate insulation film 11 and the polysilicon film 3 that will serve as the floating gate electrode until the tunnel gate oxide film 2 that is the first gate oxide film is exposed as a pattern that is perpendicular to the striped pattern of the polysilicon film 3 pattern, this being used as the control gate electrode pattern that corresponds to a word line. A schematic cross-sectional view in a direction that is perpendicular to the source-drain direction is shown in FIG. 10(c).

As described above with respect to the two examples, the source and drain diffusion layers 9 and 10 can be disposed so as to be perpendicular with respect to the direction of the trenches m1 and m2, and can also be parallel thereto.

In a third example of the present invention, as will be described with reference to FIG. 12 through FIG. 16, by adding photolithography technology, it is possible to increase the surface area between the floating gate and the control gate.

First, as shown in FIG. 12(a), on the element region of a silicon substrate 100 onto which is formed an element separation region using the LOCOS separation method, thermal oxidation is used to form a tunnel gate oxide film 2 having a thickness of 80 Angstroms. Then, a polysilicon film 3 having a thickness of 3000 Angstroms for use as a floating gate electrode, a silicon oxide film 4 having a thickness of 300 Angstroms, and a silicon nitride film 5 having a thickness of 300 Angstroms, and a silicon oxide film 6 having a thickness of 1500 Angstroms are formed in this sequence, using a CVD process. The silicon oxide film 6 is striped by using photolithography and dry etching processes (FIG. 12(b)). Additionally, the CVD process is used to form a silicon nitride film 7 having a thickness of 500 Angstroms, this being etched back to form a silicon nitride film 7 side wall on the outside of the striped silicon oxide film 6 (FIG. 12(c)). Then, wet etching is done to completely remove the silicon oxide film 6 (FIG. 13(a)). Then, CVD is used again to form a silicon oxide film 8 having a thickness of 500 Angstroms, this being etched until the silicon nitride film 5 is exposed, thereby forming a silicon oxide film 8 side wall on both side walls of the above-described silicon nitride film 7 (FIG. 13(b)). Then, dry etching is used to etch the silicon nitride films 5 and 7, and dry etching is used to remove the exposed silicon oxide film 4 (FIG. 13(c)). Additionally, the combination of the silicon oxide film 4, the silicon nitride film 5 and the silicon oxide film 8 is used as a hard mask to etch approximately 150 Angstroms of the polysilicon film 3 (FIG. 14(a)). Next, wet etching is done to completely remove the mask that is formed by the silicon oxide film 8, the silicon nitride film 5, and the silicon oxide film 4, whereupon photolithography and dry etching technologies are used to etch the striped polysilicon film 3, thereby forming the floating gate electrode 3E in the form of a trench (FIG. 14(b)). After removing the residual resist remaining on the floating gate, an ONO film 11, which is the control gate insulation film, is formed over the entire surface.

Figure 14:
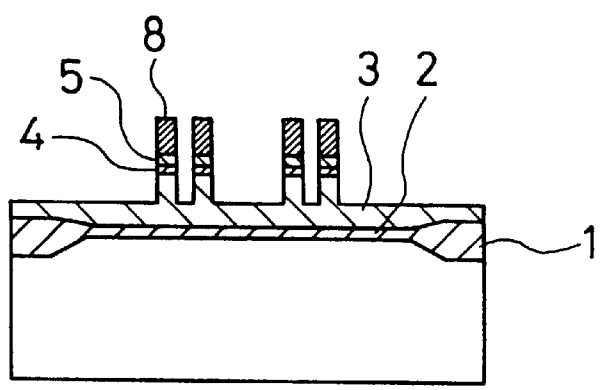
FIG. 14 is a drawing that shows the manufacturing processes subsequent to those shown in FIG. 13.
Figure 14:
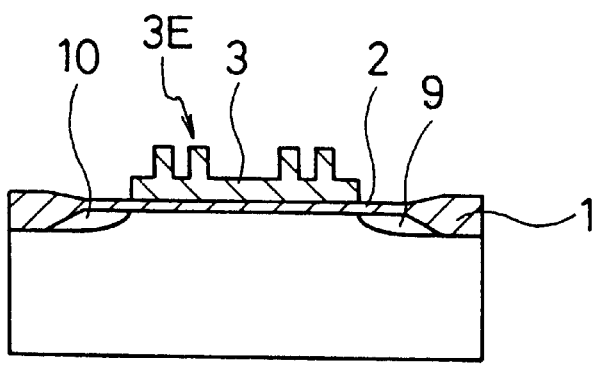
Figure 14:
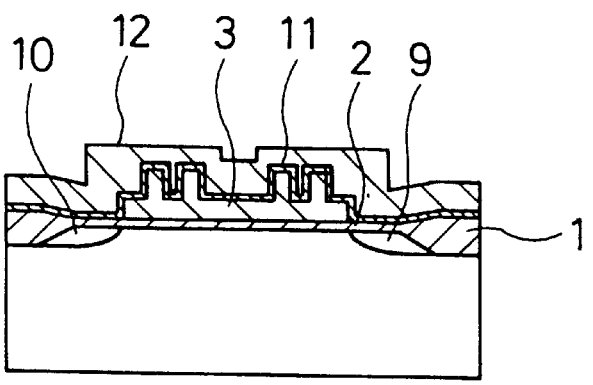
Figure 15:
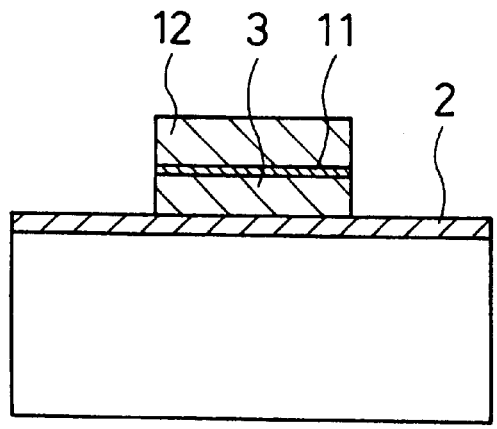
FIG. 15 is a cross-sectional view of the third example of the present invention.
Figure 16:
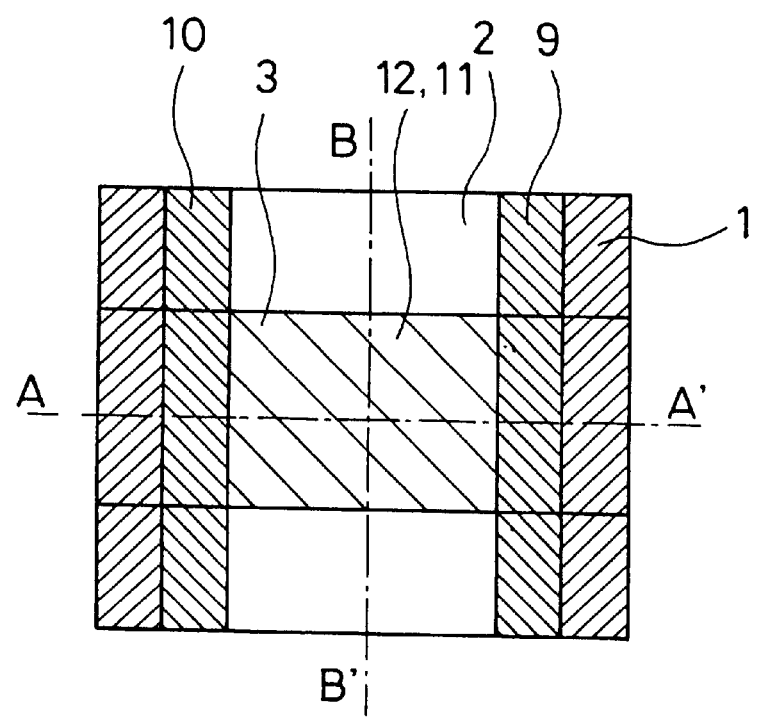
FIG. 16 is a top plan view of the third example of the present invention.
Figure 17:
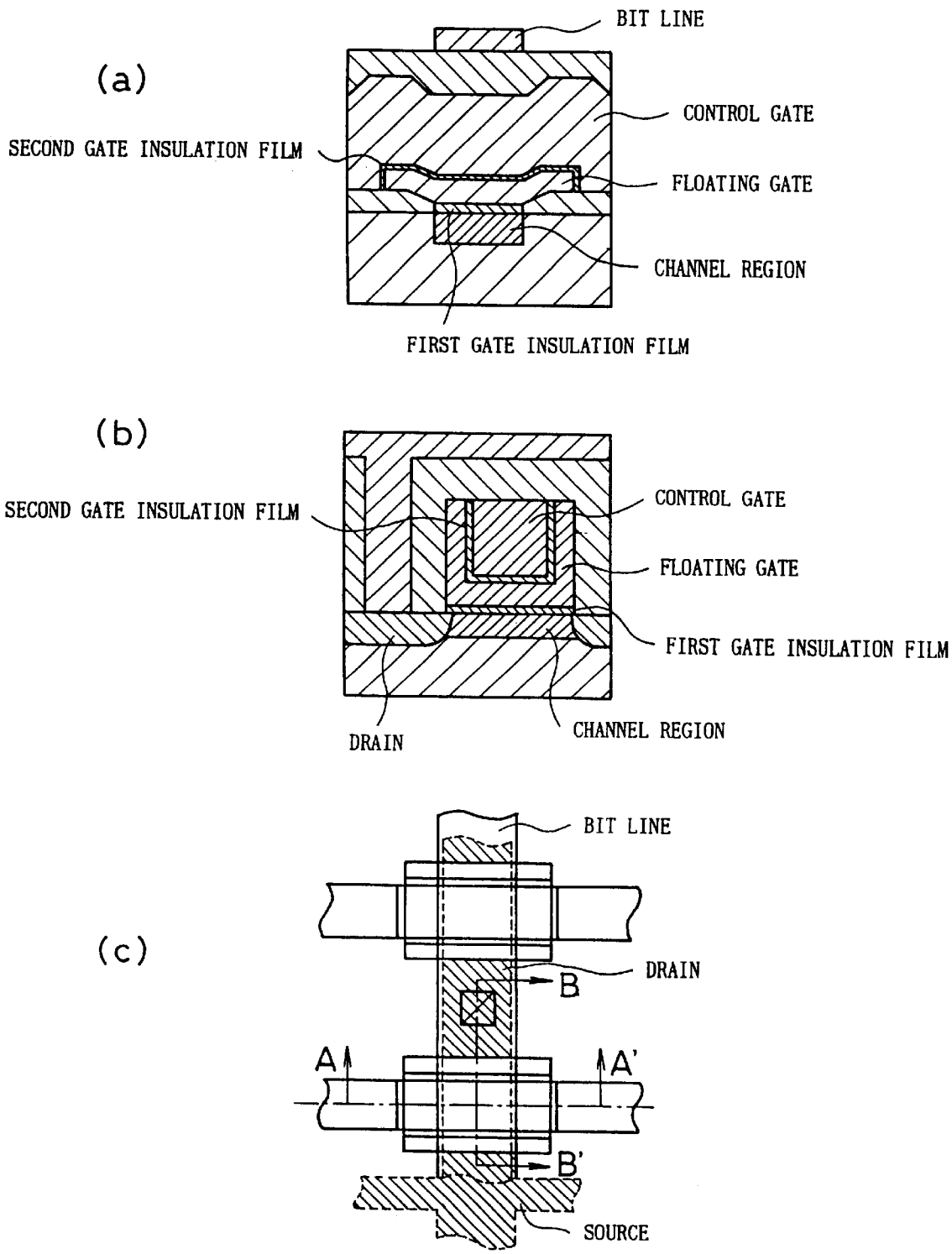
FIG. 17 is a drawing that shows the prior art.
Figure 18:
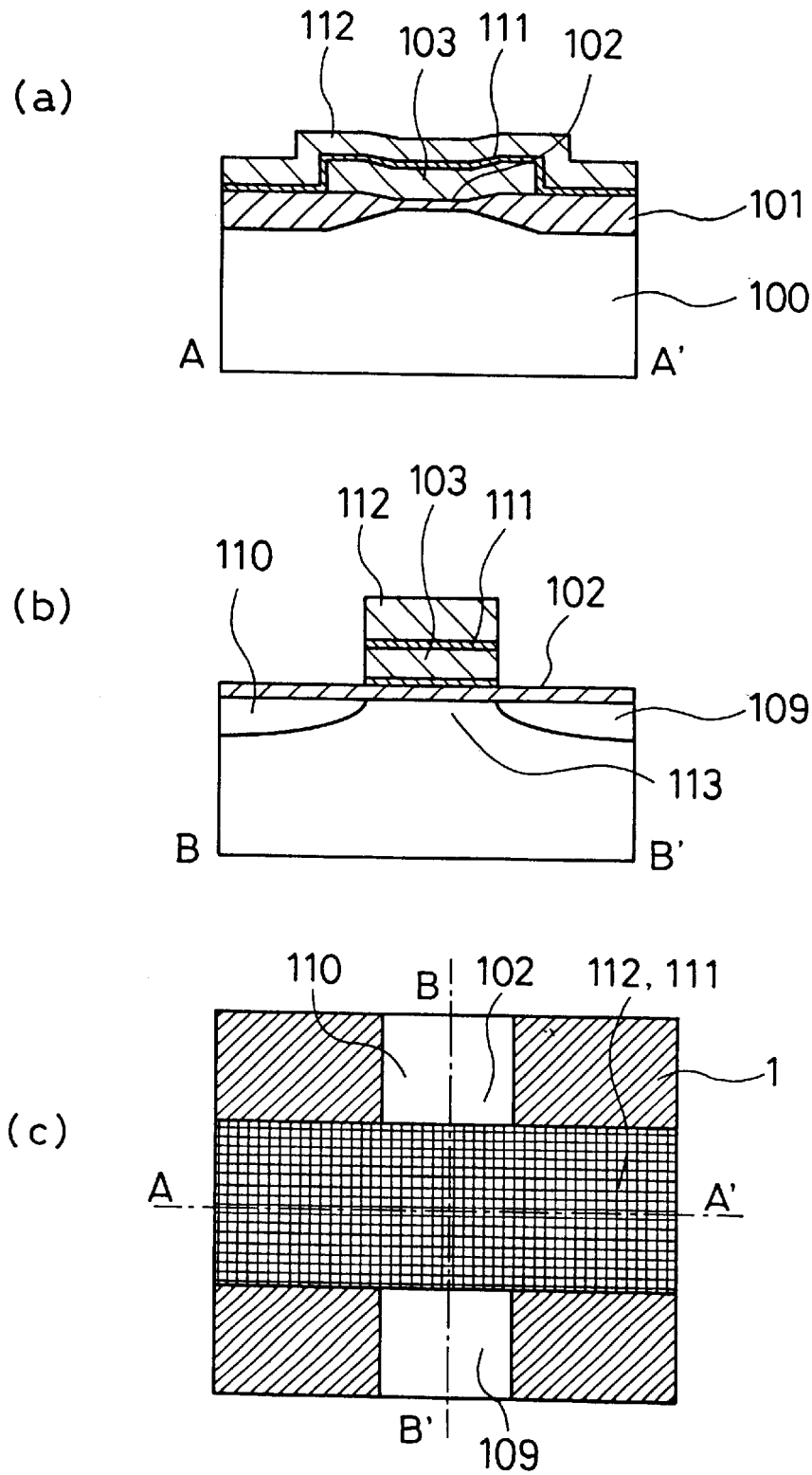
FIG. 18 is a drawing that shows the prior art.

Additionally, a polysilicon film 12 for use a control gate electrode is deposited over the entire surface of the substrate, and photolithography and dry etching are used to etch the polysilicon film 12 that will serve as the control gate 12E, the second gate insulation film 11 and the polysilicon film 3 that will serve as the floating gate electrode until the tunnel gate oxide film 2 that is the first gate oxide film is exposed as a pattern that is perpendicular to the striped pattern of the polysilicon film 3 pattern, this being used as the control gate electrode pattern that corresponds to a word line (FIG. 14(*c*)). A schematic cross-sectional view in a direction that is perpendicular to the source-drain direction is shown in FIG. 15.

According to the present invention, because it is possible to form a floating gate with two or more trench shapes, it is possible to achieve a high capacitance between the floating gate electrode and the control gate electrode of a stacked-gate type memory cell, the result being that it is possible to achieve high-speed operation with low power consumption.

What is claimed is:

1. A method of manufacturing a non-volatile semiconductor memory device, said method comprising:
   sequentially depositing in an element forming region, a first gate oxide film, a polysilicon film, a first silicon oxide film, and a first silicon nitride film, in that sequence;
   processing said first silicon nitride film to a prescribed shape and expose said first silicon oxide film;
   sequentially forming onto a side wall of said first silicon nitride film, a second silicon oxide film, a second silicon nitride film, and a third silicon oxide film, so as to form a side wall and expose said polysilicon film;
   etching said exposed polysilicon film;
   removing said first and second silicon nitride films;
   removing said exposed silicon oxide film; and
   using said second and third silicon oxide films on said polysilicon film as a mask, and etching said polysilicon film, thereby forming said floating gate that has a trench.

2. A method of manufacturing a non-volatile semiconductor memory device, said method comprising:
   sequentially depositing in an element forming region, a first gate oxide film, a polysilicon film, a first silicon oxide film, a first silicon nitride film, and a second silicon oxide film, in that sequence;
   processing said second silicon oxide film to a prescribed shape and expose said first silicon nitride film;
   forming onto a side wall of said second silicon oxide film, a second silicon nitride film side wall;
   removing said second silicon oxide film;
   forming a third silicon oxide film side wall on both sides of the remaining said second silicon nitride film;
   removing said exposed first silicon nitride film and said second silicon nitride film and expose said first silicon oxide film;
   removing said exposed first silicon oxide film; and
   using said first silicon oxide film, said first silicon nitride film, and said third silicon oxide film on said polysilicon film as a mask, and etching said polysilicon film, thereby forming said floating gate that has a trench.

3. A method of manufacturing a non-volatile semiconductor memory device having a floating gate formed in a semiconductor substrate, said method comprising:
   sequentially depositing in an element forming region, a first gate oxide film, a polysilicon film, a first silicon oxide film, and a first silicon nitride film, in that sequence;
   processing said first silicon nitride film to a prescribed shape and exposing said first silicon oxide film;
   sequentially forming onto a side wall of said first silicon nitride film, a second silicon oxide film, a second silicon nitride film, and a third silicon oxide film, so as to form a side wall and expose said polysilicon film;
   etching said exposed polysilicon film;
   removing said first and second silicon nitride films;
   removing said exposed first silicon oxide film; and
   using said second and third silicon oxide films on said polysilicon film as a mask, and etching said polysilicon film, thereby forming a floating gate having a trench.

4. The method according to claim 3, wherein said trench comprises a plurality of trenches formed on a surface of said floating gate.

5. The method according to claim 4, wherein said plurality of trenches comprises a first trench formed over said gate oxide film.

6. A method of manufacturing a non-volatile semiconductor memory device having a floating gate formed in a semiconductor substrate, said method comprising:
   sequentially depositing in an element forming region, a first gate oxide film, a polysilicon film, a first silicon oxide film, a first silicon nitride film, and a second silicon oxide film in this sequence;
   processing said second silicon oxide film to a prescribed shape and exposing said first silicon nitride film;
   forming onto a side wall of said second silicon oxide film a second silicon nitride film side wall;
   removing said second silicon oxide film;
   forming a third silicon oxide film side wall on both sides of the remaining said second silicon nitride film;
   removing said exposed first silicon nitride film and said second silicon nitride film and exposing said first silicon oxide film;
   removing said exposed first silicon oxide film; and
   using said first silicon nitride film, and said third silicon oxide film on said polysilicon film as a mask, and etching said polysilicon film, thereby forming a floating gate having a trench.

7. The method according to claim 6, wherein said trench comprises a plurality of trenches.

8. The method according to claim 7, wherein said plurality of trenches comprises a first trench formed over said gate oxide film.

9. A method of manufacturing a non-volatile semiconductor memory device comprising:
   forming a gate oxide layer and field oxide layers on a substrate;
   forming on said gate oxide layer and said field oxide layers, a polysilicon layer, and a silicon oxide layer, in that sequence;
   forming a silicon nitride film on said silicon oxide layer;
   forming a first silicon oxide sidewall on each lateral side of said silicon nitride film;
   forming a silicon nitride sidewall on each said first silicon oxide sidewall;
   forming a second silicon oxide sidewall on each said silicon nitride sidewall;
   removing lateral regions of said silicon oxide layer and an upper layer of lateral regions of said polysilicon film;
   removing said silicon nitride film and said silicon nitride sidewall to expose portions of said silicon oxide layer;
   removing said portions of said silicon oxide layer to expose portions of said polysilicon film; and etching said polysilicon film to remove a remainder of said lateral regions and to form a floating gate comprising a first trench over said gate oxide layer and second and third trenches over said field oxide layers.

10. The method according to claim 9, wherein said field oxide layers comprise a pair of field oxide layers formed at lateral ends of said floating gate.

11. The method according to claim 10, wherein said gate oxide layer has a thickness of 80 Å.

12. The method according to claim 9, wherein said forming said polysilicon layer comprises forming a polysilicon layer having a thickness of 3000 Å.

* * * * *